US011429029B2

(12) United States Patent
Van Der Schaar et al.

(10) Patent No.: US 11,429,029 B2
(45) Date of Patent: Aug. 30, 2022

(54) METHOD AND APPARATUS FOR ILLUMINATION ADJUSTMENT

(71) Applicant: ASML NETHERLANDS B.V., Veldhoven (NL)

(72) Inventors: Maurits Van Der Schaar, Eindhoven (NL); Patrick Warnaar, Tilburg (NL); Youping Zhang, Fremont, CA (US); Arie Jeffrey Den Boef, Waalre (NL); Feng Xiao, Santa Clara, CA (US); Martin Ebert, Valkenswaard (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 17/081,325

(22) Filed: Oct. 27, 2020

(65) Prior Publication Data

US 2021/0055663 A1  Feb. 25, 2021

Related U.S. Application Data

(63) Continuation of application No. 16/061,236, filed as application No. PCT/EP2016/079219 on Nov. 30, 2016, now abandoned.

(60) Provisional application No. 62/269,004, filed on Dec. 17, 2015.

(51) Int. Cl.
*G03F 7/20* (2006.01)
*G03F 9/00* (2006.01)

(52) U.S. Cl.
CPC ...... *G03F 7/70625* (2013.01); *G03F 7/70358* (2013.01); *G03F 7/70633* (2013.01); *G03F 9/7076* (2013.01)

(58) Field of Classification Search
CPC ............ G03F 7/70625; G03F 7/70358; G03F 7/70633; G03F 9/7076
USPC ....................................................... 430/22, 30
See application file for complete search history.

(56) References Cited

U.S. PATENT DOCUMENTS

| 7,466,413 | B2 | 12/2008 | Finders et al. |
| 8,797,554 | B2 | 8/2014 | Straaijer |
| 2006/0066855 | A1 | 3/2006 | Den Boef et al. |
| 2008/0144036 | A1 | 6/2008 | Van Der Schaar et al. |
| 2012/0224176 | A1 | 9/2012 | Hammond |
| 2012/0327503 | A1 | 12/2012 | Manassen et al. |
| 2013/0141730 | A1 | 6/2013 | Quintanilha |
| 2014/0132948 | A1 | 5/2014 | Shchegrov |

FOREIGN PATENT DOCUMENTS

| TW | 201245898 | 11/2012 |
| WO | 2014/198516 | 12/2014 |
| WO | 2015/143378 | 9/2015 |

OTHER PUBLICATIONS

International Search Report and Written Opinion issued for International Patent Application No. PCT/EP2016/079219, dated Mar. 27, 2017.
Taiwanese Office Action issued in corresponding Taiwanese Patent Application No. 105141787 dated May 20, 2019.

*Primary Examiner* — Christopher G Young
(74) *Attorney, Agent, or Firm* — Pillsbury Winthrop Shaw Pittman, LLP

(57) ABSTRACT

A method includes projecting an illumination beam of radiation onto a metrology target on a substrate, detecting radiation reflected from the metrology target on the substrate, and determining a characteristic of a feature on the substrate based on the detected radiation, wherein a polarization state of the detected radiation is controllably selected to optimize a quality of the detected radiation.

20 Claims, 4 Drawing Sheets

FIG. 7

METHOD AND APPARATUS FOR ILLUMINATION ADJUSTMENT

This application is a continuation of U.S. patent application Ser. No. 16/061,236, which was filed Jun. 11, 2018, now allowed, which is the U.S. national phase entry of PCT patent application no. PCT/EP2016/079219, which was filed on Nov. 30, 2016, which claims the benefit of priority of U.S. provisional application no. 62/269,004, which was filed on Dec. 17, 2015, each of which is incorporated herein in its entirety by reference.

FIELD

The present disclosure relates generally to metrology methods and tools for use in lithographic apparatuses and more particularly to methods and tools incorporating systems that may provide variable illumination settings to obtain information regarding metrology targets.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

SUMMARY

In order to allow a number of patterned layers to be positioned on a substrate, it is desirable to accurately set the position of the substrate relative to the radiation beam and the patterning device. This may be performed by accurately positioning the substrate on a substrate table and positioning the substrate table relative to the radiation beam and the patterning device.

Alignment of the substrate may be performed. In one alignment system, a number of alignment marks on the substrate are measured to derive a coordinate system, which is compared to a modelled grid to derive the positions of features on the substrate. Clamping of the substrate on the substrate table, or wafer distortion occurring in non-lithography process steps, may cause distortion of the substrate, which can be monitored by comparison of the measurements to the grid. Models describing the wafer grid may be created which are used in exposing wafers so as to compensate for the distortions.

One property of particular interest is overlay, i.e., the alignment of successive layers formed on the substrate. Measurements of overlay may be made using a modelled grid as described above. Grid models describing the overlay error over the substrate with respect to the previous layer may be produced and used in a control loop to ensure lot to lot consistency.

In order to provide a useful model for substrate properties across the substrate, a number of positions at which measurements may be made may be required. Accordingly, when a layout of a substrate, namely the arrangement of patterns to be formed on the substrate, is planned, a number of sample positions are provided. The requisite substrate property may be measured at each sample position or derived from measurements made at each sample position.

The present description relates to methods and apparatus for using patterning device induced phase in, for example, optimization of the patterning device pattern and one or more properties of illumination of the patterning device, in design of the one or more structural layers on the patterning device, and/or in computational lithography.

In an aspect, there is a method including A method includes projecting an illumination beam of radiation onto a metrology target on a substrate, detecting radiation reflected from the metrology target on the substrate, and determining a characteristic of a feature on the substrate based on the detected radiation, wherein a polarization state of the detected radiation is controllably selected to optimize a quality of the detected radiation.

In an aspect, there is provided a method of manufacturing devices wherein a device pattern is applied to a series of substrates using a lithographic process, the method including preparing the device pattern using a method described herein and exposing the device pattern onto the substrates.

In an aspect, there is provided a non-transitory computer program product comprising machine-readable instructions configured to cause a processor to cause performance of a method described herein.

In an aspect, there is provided a method of manufacturing devices wherein a device pattern is applied to a series of substrates using a lithographic process, the method including adapting the design for the patterning device using the method described herein.

BRIEF DESCRIPTION OF THE DRAWINGS

Embodiments will now be described, by way of example only, with reference to the accompanying drawings in which:

FIG. 7 is a schematic illustration of a variable pupil in accordance with an embodiment.

DETAILED DESCRIPTION

Before describing embodiments in detail, it is instructive to present an example environment in which embodiments may be implemented.

Figure 1:
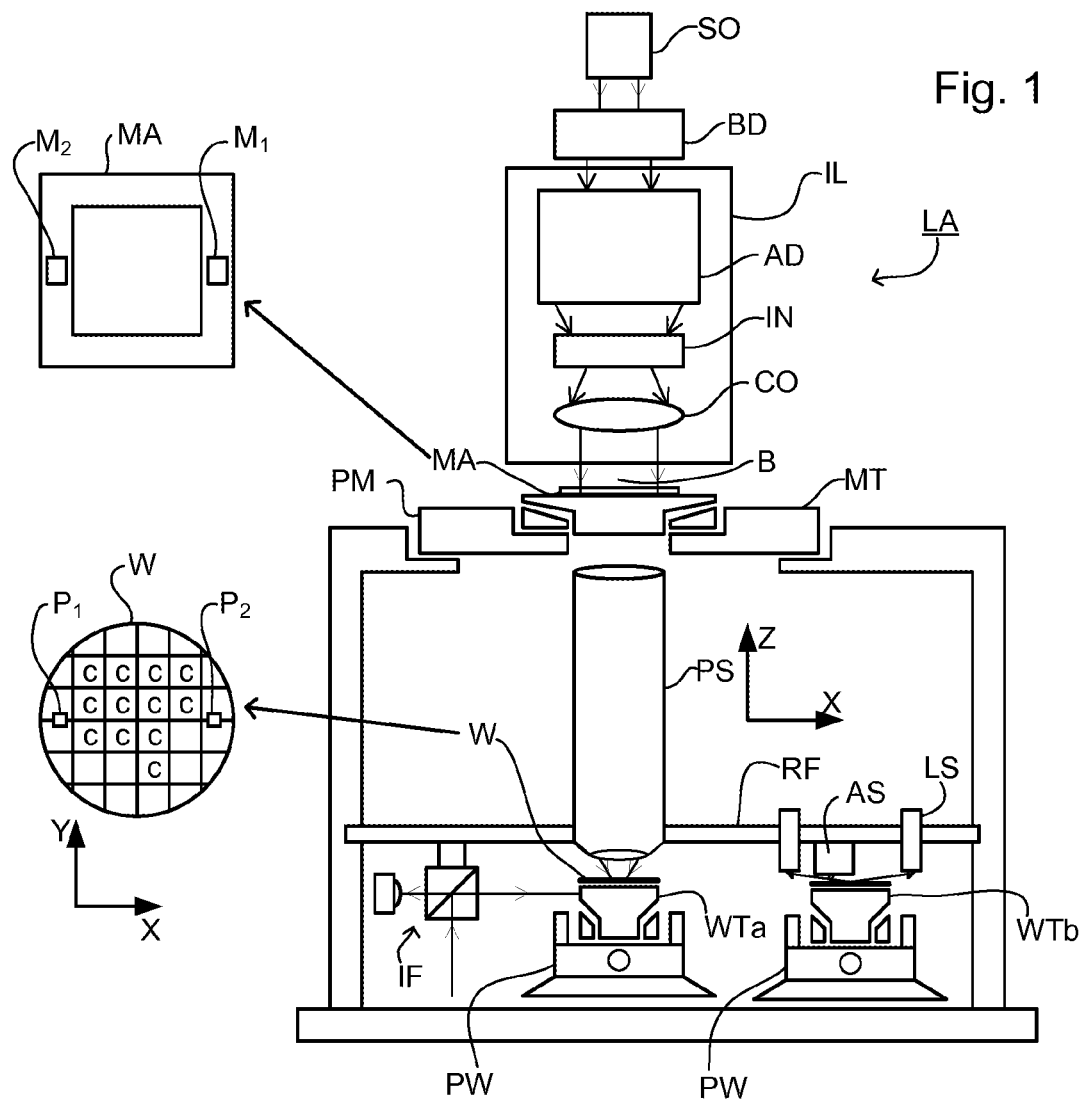
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
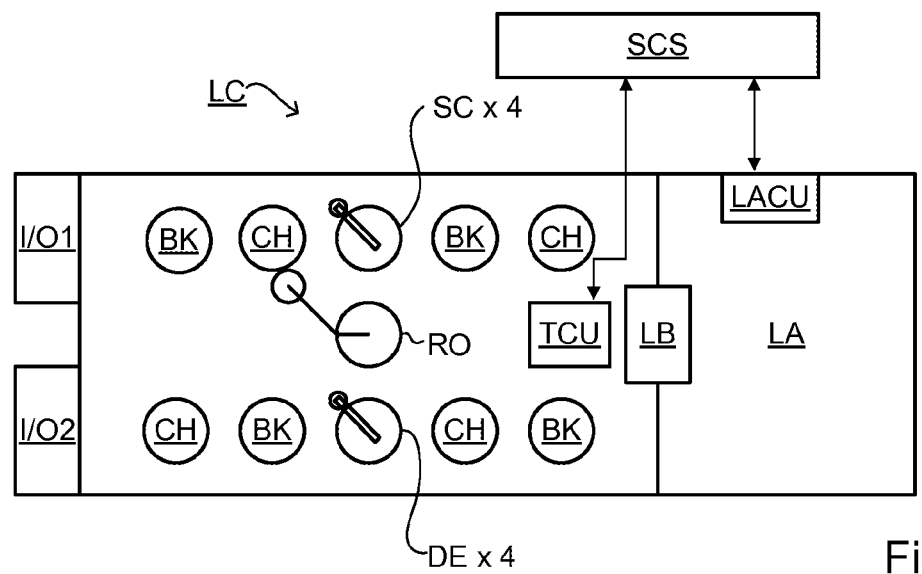
FIG. 2 schematically depicts an embodiment of a lithographic cell or cluster.

As shown in FIG. 2, the lithographic apparatus LA may form part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates. This may particularly useful, for example, if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g., the time of a trim etch step can be adjusted to compensate for substrate-to-substrate CD variation resulting from the lithographic process step.

In an embodiment, a patterning device MA may be provided with a functional pattern (i.e. a pattern which will form part of an operational device). Alternatively or additionally, the patterning device may be provided with a measurement pattern which does not form part of the functional pattern. The measurement pattern may be, for example, located to one side of the functional pattern. The measurement pattern may be used, for example, to measure alignment of the patterning device relative to the substrate table WT (see FIG. 1) of the lithographic apparatus, or may be used to measure some other parameter (e.g., overlay). The techniques described herein may be applied to such a measurement pattern.

In accordance with various embodiments of the invention, wafer features and lithographic apparatus attributes, either measured or simulated, may be used to update a design for the reticle to improve performance. In one example, locations of metrology targets (measurement patterns) may be located in accordance with measured and/or simulated features of the wafer such that the effects of the wafer features and apparatus attributes are reduced. Alternately, similar features of the wafer and/or lithographic system may be used to update positions and/or orientations for the functional patterns.

By way of introduction, the operation of an inspection apparatus making use of metrology targets is described. An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g., for the purpose of process control.

Figure 3:
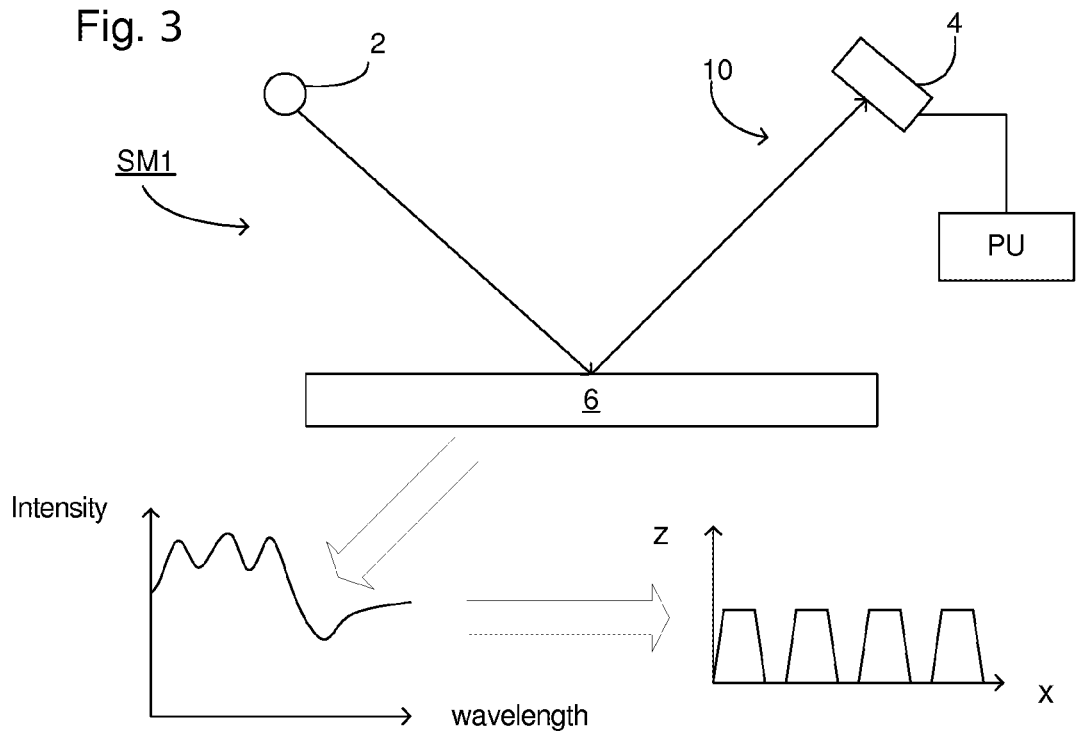
FIG. 3 schematically depicts an embodiment of a scatterometer for use as a metrology device.

FIG. 3 depicts an embodiment of a scatterometer SM1. It comprises a broadband (white light) radiation projector 2 which projects radiation onto a substrate 6. The reflected radiation is passed to a spectrometer detector 4, which measures a spectrum 10 (i.e., a measurement of intensity as a function of wavelength) of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
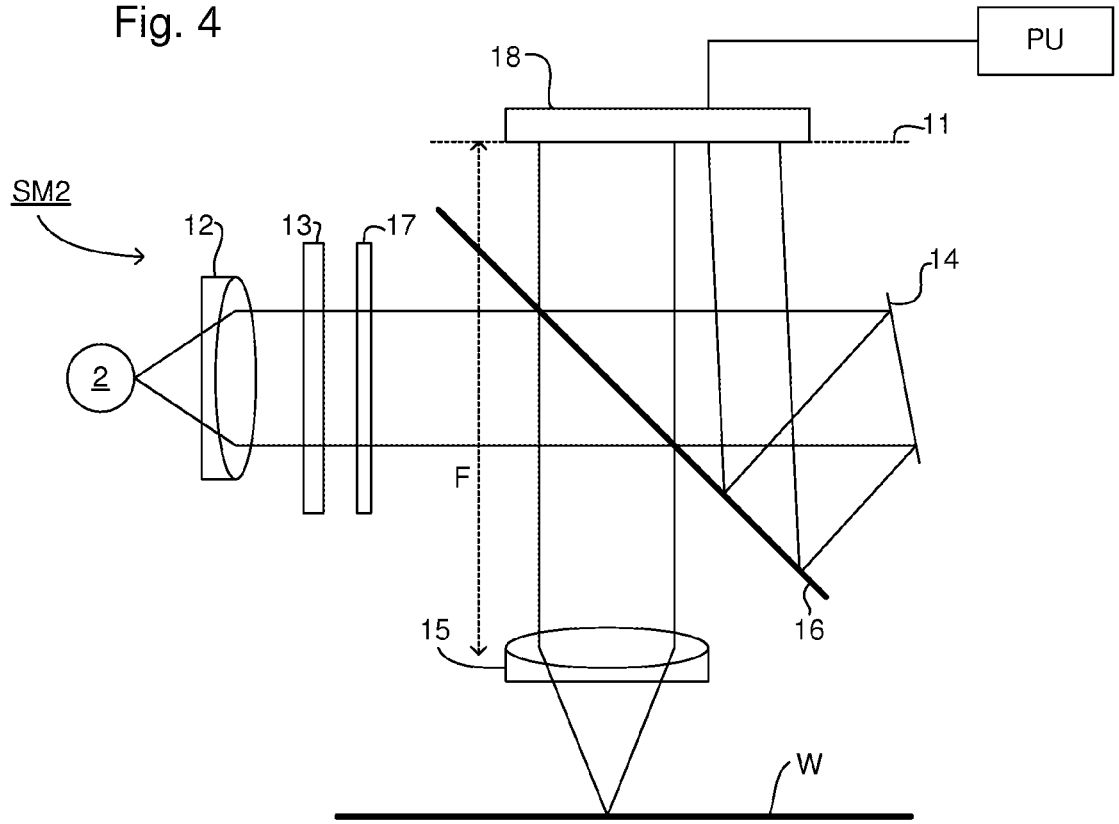
FIG. 4 schematically depicts another embodiment of a scatterometer for use as a metrology device.

Another embodiment of a scatterometer SM2 is shown in FIG. 4. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e., a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic-(TM) and transverse electric-(TE) polarized radiation and/or the phase difference between the transverse magnetic- and transverse electric-polarized radiation.

Using a broadband radiation source 2 (i.e., one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e., twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. Patent Application Publication No. US 2006-0066855, which document is hereby incorporated in its entirety by reference.

By comparing one or more properties of the beam before and after it has been redirected by the target, one or more properties of the substrate may be determined. This may be done, for example, by comparing the redirected beam with theoretical redirected beams calculated using a model of the substrate and searching for the model that gives the best fit between measured and calculated redirected beams. Typically a parameterized generic model is used and the parameters of the model, for example width, height and sidewall angle of the pattern, are varied until the best match is obtained.

Two main types of scatterometer are used. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity (or intensity ratio and phase difference in case of an ellipsometric configuration) of the scattered radiation as a function of angle. Alternatively, measurement signals of different wavelengths may be measured separately and combined at an analysis stage. Polarized radiation may be used to generate more than one spectrum from the same substrate.

In order to determine one or more parameters of the substrate, a best match is typically found between the theoretical spectrum produced from a model of the substrate and the measured spectrum produced by the redirected beam as a function of either wavelength (spectroscopic scatterometer) or angle (angularly resolved scatterometer). To find the best match there are various methods, which may be combined. For example, a first method is an iterative search method, where a first set of model parameters is used to calculate a first spectrum, a comparison being made with the measured spectrum. Then a second set of model parameters is selected, a second spectrum is calculated and a comparison of the second spectrum is made with the measured spectrum. These steps are repeated with the goal of finding the set of parameters that gives the best matching spectrum. Typically, the information from the comparison is used to steer the selection of the subsequent set of parameters. This process is known as an iterative search technique. The model with the set of parameters that gives the best match is considered to be the best description of the measured substrate.

A second method is to make a library of spectra, each spectrum corresponding to a specific set of model parameters. Typically the sets of model parameters are chosen to cover all or almost all possible variations of substrate properties. The measured spectrum is compared to the spectra in the library. Similarly to the iterative search method, the model with the set of parameters corresponding to the spectrum that gives the best match is considered to be the best description of the measured substrate. Interpolation techniques may be used to determine more accurately the best set of parameters in this library search technique.

In any method, sufficient data points (wavelengths and/or angles) in the calculated spectrum should be used in order to enable an accurate match, typically between 80 up to 800 data points or more for each spectrum. Using an iterative method, each iteration for each parameter value would involve calculation at 80 or more data points. This is multiplied by the number of iterations needed to obtain the correct profile parameters. Thus many calculations may be required. In practice this leads to a compromise between accuracy and speed of processing. In the library approach, there is a similar compromise between accuracy and the time required to set up the library.

In any of the scatterometers described above, the target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes. Lines in targets may be made up of sub-units, including near or sub-resolution features that together define lines of the gratings, such as are described in U.S. Pat. No. 7,466,413.

While embodiments of a scatterometer have been described herein, other types of metrology apparatus may be used in an embodiment. For example, a dark field metrology apparatus such as described in U.S. Pat. No. 8,797,554, which is incorporated herein in its entirety by reference, may be used. Further, those other types of metrology apparatus may use a completely different technique than scatterometry.

Targets as described herein may be, for example, overlay targets designed for use in the Yieldstar stand-alone or integrated metrology tools, and/or alignment targets such as those typically used with TwinScan lithographic systems, both available from ASML of Veldhoven, NL.

In general, metrology targets for use with such systems should be printed on the wafer with dimensions that meet the design specification for the particular microelectronic device to be imaged on that wafer. As processes continue to push against the limits of lithographic device imaging resolution in advanced process nodes, the design rule and process compatibility requirement place stress on the selection of appropriate targets. As the targets themselves become more advanced, often requiring the use of resolution enhancement technology, such as phase-shift masks, and optical proximity correction, the printability of the target within the process design rules becomes less certain. As a result, proposed marks may be subject to testing in order to confirm their viability, both from a printability and a detectability standpoint. In a commercial environment, good overlay mark detectability may be considered to be a combination of low total measurement uncertainty as well as a short move-acquire-move time, as slow acquisition is detrimental to total throughput for the production line. Modern microdiffraction-based-overlay targets (μDBO) may be on the order of 10 μm on a side, which provides an inherently lower detection signal compared to 40×160 μm$^2$ targets such as those used in the context of monitor wafers.

Additionally, once marks that meet the above criteria have been selected, there is a possibility that detectability will change with respect to process variations, such as film thickness variation, various etch biases, and geometry asymmetries induced by the etch and/or polish processes. Therefore, it may be useful to select a target that has low detectability variation and low overlay/alignment variation against various process variations. Likewise, the fingerprint (printing characteristics, including, for example, lens aberration) of the specific machine that is to be used to produce the microelectronic device to be imaged will, in general, affect the imaging and production of the target marks. It may therefore be useful to ensure that the marks are resistant to fingerprint effects, as some patterns will be more or less affected by a particular lithographic fingerprint.

Figure 5:
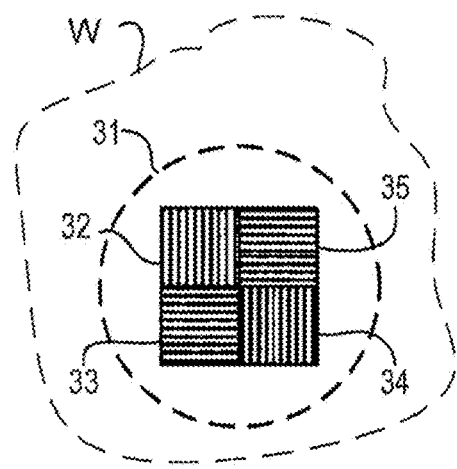
FIG. 5 depicts a composite metrology target formed on a substrate.

FIG. 5 depicts a composite metrology target formed on a substrate according to known practice. The composite target comprises four gratings 32, 33, 34, 35 positioned closely together so that they will all be within a measurement spot 31 formed by the illumination beam of the metrology apparatus. The four targets thus are all simultaneously illuminated and simultaneously imaged on sensor 4, 18. In an example dedicated to overlay measurement, gratings 32, 33, 34, 35 are themselves composite gratings formed by overlying gratings that are patterned in different layers of the semi-conductor device formed on substrate W. Gratings 32, 33, 34, 35 may have differently biased overlay offsets in order to facilitate measurement of overlay between the layers in which the different parts of the composite gratings are formed. Gratings 32, 33, 34, 35 may also differ in their orientation, as shown, so as to diffract incoming radiation in X and Y directions. In one example, gratings 32 and 34 are X-direction gratings with biases of +d, −d, respectively. This means that grating 32 has its overlying components arranged so that if they were both printed exactly at their nominal locations, one of the components would be offset relative to the other by a distance d. Grating 34 has its components arranged so that if perfectly printed there should be an offset of d, but in the opposite direction to the first grating and so on. Gratings 33 and 35 may be Y-direction gratings with offsets +d and −d respectively. While four gratings are illustrated, another embodiment may include a larger matrix to obtain desired accuracy. For example, a 3×3 array of nine composite gratings may have biases −4$d$, −3$d$, −2$d$, −d, 0, +d, +2$d$, +3$d$, +4$d$. Separate images of these gratings can be identified in the image captured by sensor 4, 18.

Measuring focus, overlay and CD on product wafers can be used to determine process errors in producing the product wafers. On the other hand, because marker positions are generally located at positions different from functional structures, and those positions undergo different processing and otherwise have different attributes that affect the ability to ensure that the measurements at marker positions correlate well to actual functional structure attributes. For example, where a target is located in a scribe lane, it may be at a height that differs from a height of a current functional layer of the functional circuit being produced. Likewise, where measurements are distant from critical focus, overlay or critical dimension uniformity constraints, the measurements may not reflect the information that they are intended to.

As noted above, the detector may be configured to make use of TM or TE polarized light. As will be appreciated, it may also be possible to use a combination of the two polarizations to obtain additional information. In practice, the light may be transmitted from the source using a pair of optical fibers. The light in one of the fibers is TE while the light in the other is TM. The light from the two fibers may be combined to obtain a light having a combination of both states.

In an embodiment, the system may be designed to provide additional flexibility. In this approach, one or both fibers may include an associated attenuator. By appropriate adjustment of the attenuator or attenuators, the polarization state TE+TM may be modified to provide a variety of different states. The combined state may be parameterized as $\alpha$*TE+ (1-$\alpha$)*TM.

The attenuator may be embodied, for example, as a neutral density filter that may be placed before or after the fiber, but before the two fibers are combined. This neutral density filter may be a programmable grey filter.

To determine alpha, the two signals may be measured separately and the ratio calculated, or if one or more programmable filters is being used, the ratio may be calculated in software based on the programmed state of the filters.

In an alternate embodiment, rather than an attenuator, a half wave plate may be introduced for one or both fibers. By rotating the plate, the polarization state of the illumination is also rotated.

Figure 6:
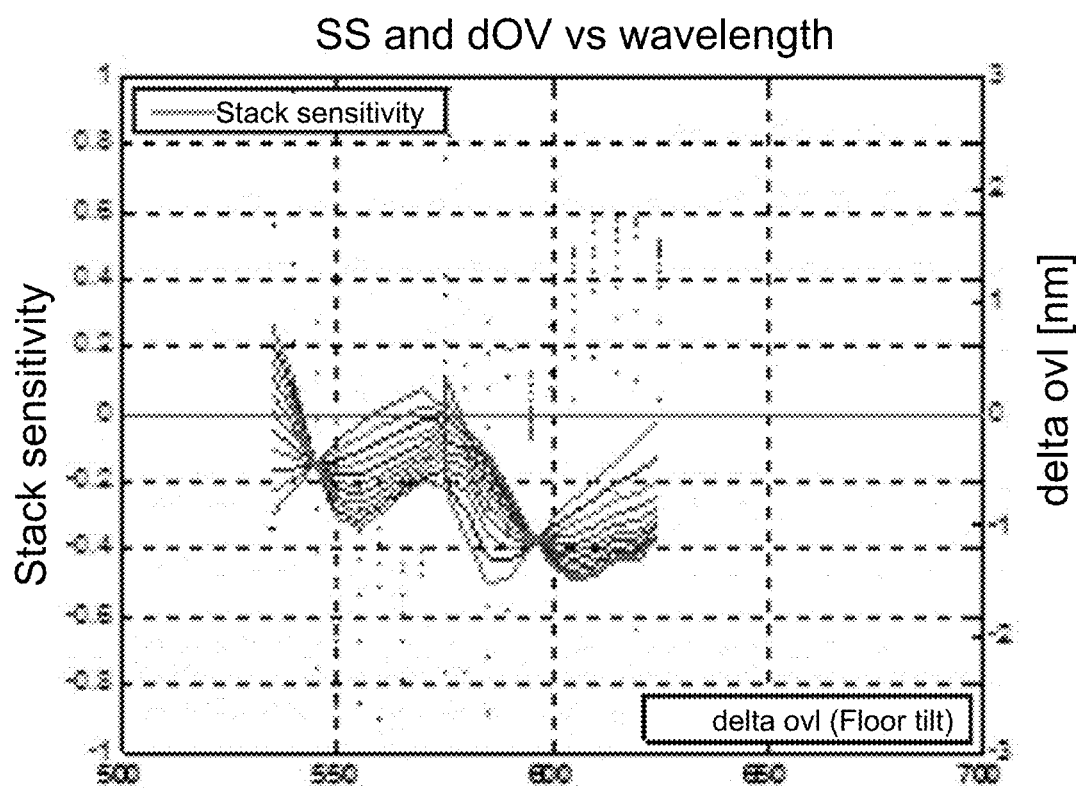
FIG. 6 is a graph illustrating changes in stack sensitivity in response to illumination tuning in accordance with an embodiment of the invention.

FIG. 6 shows an example of the effect of polarization tuning for a simulated response. Specifically, stack sensitivity (lines) and overlay error (dots) are shown vs wavelength for a variety of values of alpha. As will be understood by the skilled artisan, larger magnitude of sensitivity is generally preferable, as is stability vs. wavelength. The selection of a sufficiently sensitive and sufficiently stable stack sensitivity may be made in accordance with generally understood principles.

In general, alpha can be selected to minimize the impact of overlay error introduced by defects. Thus, in an embodiment, the polarization state is optimized for reduction of residual error. As will be appreciated other parameters could be optimized using the same polarization tuning approach, for example grating deformation. Choosing the best alpha for a particular measurement task will involve selection of an alpha that provides a sufficiently high degree of stack sensitivity and sufficiently high stability vs. wavelength performance to allow the desired measurements. As will be appreciated, the requirements will depend on the required performance for the measurement task, which will vary among wafer layouts and design specifications. Such optimization may be performed based on simulations, or may be made using measured data from intermediate design imaging in an iterative design process for recipe selection. Stability of stack sensitivity may also constitute a selection criterion, for example.

In an embodiment, the polarization adjustment may be implemented using a machine parameter adjustment such as a "knob" or software parameter selection. In one implementation, a particular target or targets that are not able to be measured by tuning the polarization knob to specifically view those targets.

In an embodiment, neither of the above described hardware solutions to polarization superpositions may be required. Instead, serially acquired measurements using a first polarization state and a second polarization state may be combined in system software to create the superposed state from which additional information regarding the target may be determined. In this approach, rather than mixing the polarizations to form a new polarization state prior to making the measurement, the information from each measurement is superposed to produce superposed measurement information.

As described above, the pupil plane 11 of the system may be imaged onto the director by way with auxiliary optics (not shown) onto the detector 18. In an embodiment, the auxiliary optics may include an addressable device configured to modify the pupil such that angle-resolved images may be obtained without the use of a plenoptic camera. Likewise, such an addressable device may be configured to allow for separate acquisition of vertical and horizontal polarization states. In principle, each acquisition in a series of measurements may use a different pupil arrangement.

Figure 7:
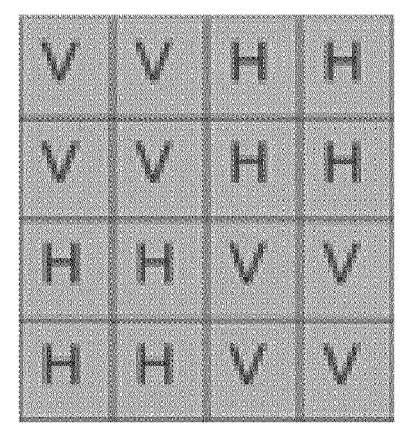

In an embodiment, the addressable device may include a liquid crystal panel with separately addressable regions as illustrated in FIG. 7. Though the illustrated embodiment contains a four by four grid of programmable regions, the more general case of variably addressable portions of the pupil should be understood. As will be appreciated, the FIG. 7 example may find use with a target such as the one illustrated in FIG. 5, in which each quadrant of the target has a highly polarization dependent structure such that by selection of appropriate polarization for each quadrant, the overall image quality may be improved.

As shown in the Figure, the addressable regions may be set to preferentially pass a selected polarization state H, V for each region. The regions may be used cooperatively to form larger regions for each state. Likewise, each region in the four by four grid illustrated may be understood to comprise a plurality of smaller addressable elements. In the example of a liquid crystal panel, each region may comprise a plurality of pixels that may be combined to form any number of regions within the area of the panel.

Because liquid crystal panels are available with switching times on the order of 50-60 Hz, and measurement times are similar in scale, they are particularly well suited to this application.

As will be appreciated, it is possible to change the layout of the addressable device between time-adjacent data acquisitions. That is, a first acquisition may have a first illumination profile and a second acquisition may have a different, second illumination profile. By varying the illumination profile over a series of acquisitions over time, it may be possible to create a variety of polarization superpositions, similar to the superpositions created using the above described variable polarization illumination. In an embodiment, a weighted average between the different polarizations may be used to provide improved performance over a straightforward combination of information from the two separate polarization measurements.

Furthermore, it may be possible to create an angle-resolved image without using a movable pinhole or microlens array as is used in plenoptic camera devices. Furthermore, it may be possible to rapidly acquire 0 and 90 degree polarized images without reconfiguring other aspects of the system.

By using the addressable pupil approach, target reconstruction may be performed, allowing for approximation of the target profile, which may then be used to model target asymmetries, which in turn can be used to reduce or eliminate the effect of such asymmetries on overlay error.

As will be appreciated, the addressable pupil approach and the variable illumination approach may be used individually or in combination to produce a large variety of illumination modes for target measurement.

Contrast as discussed herein includes, for an aerial image, image log slope (ILS) and/or normalized image log slope (NILS) and, for resist, dose sensitivity and/or exposure latitude.

The terms "optimize", "optimizing" and "optimization" as used herein mean adjusting a lithographic process parameter such that results and/or processes of lithography have a more desirable characteristic, such as higher accuracy of projection of a design layout on a substrate, a larger process window, etc.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

This computer program may be included, for example, with or within the imaging apparatus of FIG. 1 and/or with or within the control unit LACU of FIG. 2. Where an existing apparatus, for example of the type shown in FIGS. 1 and 2, is already in production and/or in use, an embodiment can be implemented by the provision of updated computer program products for causing a processor of the apparatus to perform a method as described herein.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

Although specific reference may have been made above to the use of embodiments in the context of lithography using radiation, it will be appreciated that an embodiment of the invention may be used in other applications, for example imprint lithography, and where the context allows, is not limited to lithography using radiation. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The patterning device described herein may be referred to as a lithographic patterning device. Thus, the term "lithographic patterning device" may be interpreted as meaning a patterning device which is suitable for use in a lithographic apparatus.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The invention may further be described using the following clauses:

1. A method comprising:
projecting an illumination beam of radiation onto a metrology target on a substrate;
detecting radiation reflected from the metrology target on the substrate; and
determining a characteristic of a feature on the substrate based on the detected radiation,
wherein a polarization state of the detected radiation is controllably selected to optimize a quality of the detected radiation.
2. A method according to clause 1, wherein the controllably selecting comprises selecting a ratio of TE to TM polarization in the illumination beam.
3. A method according to clause 2, wherein the optimization comprises determining a performance characteristic for each of a plurality of polarization states and selecting a polarization state for which the performance characteristic is the best.
4. A method according to clause 3, wherein the performance characteristic is selected from stack sensitivity, overlay error, signal to noise ratio, and stability vs wavelength.
5. A method according to any of clauses 1 to 4, wherein the controllably selecting comprises performing a plurality of measurements using a plurality of polarization states and combining the measurements to obtain a combined measurement having characteristics related to a superposition of the plurality of polarization states.
6. A method according to clause 5, wherein each polarization state is selected from TE and TM, and a respective number of measurements using each polarization state defines a ratio of TE to TM polarization in the illumination beam.
7. A method according to any of clauses 2 to 4, wherein the selection of a ratio of TE to TM polarization is performed by controllably attenuating one or both of a TE illumination and a TM illumination.
8. A method according to clause 7, wherein the controllably attenuating comprises filtering with a neutral density filter.
9. A method according to clause 7, wherein the controllably attenuating comprises combining a TE illumination with a TM illumination using a variable ratio optical combiner.
10. A method according to any of clauses 2 to 4, wherein the selection of a ratio of TE to TM polarization is performed by rotation of a half-wave plate configured and arranged to change a polarization state of the illumination.
11. A method according to clause 1, wherein the controllably selecting a polarization state of the detected radiation comprises filtering the radiation using an addressable array of polarizing elements to polarize selected portions of the radiation at a pupil plane of a metrology apparatus used to perform the method.
12. A method according to clause 11 wherein the addressable array of polarizing elements comprises a liquid crystal panel.
13. A non-transitory computer program product comprising machine-readable instructions configured to cause a processor to cause performance of the method according to any of clauses 1 to 12.
14. A method of manufacturing devices wherein a device pattern is applied to a series of substrates using a lithographic process, the method including adapting the design for the patterning device using the method of any of clauses 1 to 12 and exposing at least a part of the patterning device onto the substrates.
15. The method of manufacturing according to clause 14, wherein the method further includes determining the imaging parameters before exposing the at least part of the patterning device.
16. A scatterometer comprising:
a radiation source configured and arranged to project an illumination beam of radiation onto a metrology target on a substrate;
a detector, configured and arranged to detect radiation reflected from the metrology target on the substrate; and
a polarization controller configured and arranged to controllably select a polarization state of the detected radiation is controllably selected to optimize a quality of the detected radiation based on a characteristic of a feature on the substrate determined based on the detected radiation.
17. The scatterometer according to clause 16, wherein: the radiation source comprises:
a pair of sources, one of the pair of sources being configured and arranged to produce TE polarized light in the illumination beam of radiation, the other of the pair of sources configured and arranged to produce TM polarized light in the illumination beam of radiation, and
an optical element configured and arranged to controllably select a ratio of TE to TM polarization in the illumination beam.
18. The scatterometer according to clause 17, wherein: the optical element comprises at least one attenuator, configured and arranged to adjust a relative attenuation of the TE and TM polarized light.
19. The scatterometer according to clause 18, wherein the attenuator comprises a neutral density filter.
20. The scatterometer according to clause 18, wherein the attenuator comprises a variable ratio optical combiner.
21. The scatterometer according to clause 16, wherein the optical element comprises a rotatable half-wave plate configured and arranged to change a polarization state of the illumination.
22. A lithographic apparatus comprising the scatterometer according to any of clauses 16 to 21.

The embodiment(s) described, and references in the specification to an "embodiment", "example," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method comprising:
projecting an illumination beam of radiation onto a metrology target on a substrate in the form of a plurality of illuminations of the same metrology target;
detecting radiation reflected from the metrology target on the substrate; and
determining a characteristic of a feature on the substrate based on the detected radiation from the plurality of illuminations,
wherein an illumination profile of the illumination beam is varied for each illumination of multiple illuminations of the plurality of illuminations of the same metrology target.

2. The method according to claim 1, wherein the multiple illuminations comprise a plurality of polarization states and comprising performing a plurality of measurements using the plurality of polarization states and combining the measurements to obtain a combined measurement having characteristics related to a superposition of the plurality of polarization states.

3. The method according to claim 2, wherein each polarization state is selected from TE and TM.

4. The method according to claim 1, wherein the multiple illuminations comprise a plurality of polarization states and comprising filtering the radiation using an addressable array of polarizing elements to polarize selected portions of the radiation at a pupil plane of a metrology apparatus used to perform the method.

5. The method according to claim 4 wherein the addressable array of polarizing elements comprises a liquid crystal panel.

6. A method of manufacturing devices wherein a device pattern is applied to a series of substrates using a lithographic process, the method including performing the method according to claim 1 and exposing at least a part of the patterning device onto the substrates.

7. The method according to claim 1, further comprising creating an angle-resolved image from the detected radiation from each of the multiple illuminations.

8. The method according to claim 1, wherein the illumination profile for a first illumination of the multiple illuminations comprises a linear polarization in a first direction and without linear polarization in a second direction different than the first polarization and a second illumination of the multiple illuminations comprises a linear polarization in the second direction and without linear polarization in the first direction.

9. The method according to claim 1, wherein a switching time between two different illumination profiles is essentially the same as or less than a measurement time for an illumination of the metrology target.

10. A non-transitory computer program product comprising machine-readable instructions therein, the instructions, when executed by a processor system, configured to cause the processor system to at least:
cause projection of an illumination beam of radiation onto a metrology target on a substrate in the form of a plurality of illuminations of the same metrology target;
cause detection of radiation reflected from the metrology target on the substrate; and
determine a characteristic of a feature on the substrate based on the detected radiation from the plurality of illuminations,
wherein an illumination profile of the illumination beam is varied for each illumination of multiple illuminations of the plurality of illuminations of the same metrology target.

11. The computer program product according to claim 10, wherein the instructions are further configured to cause the processor system to create an angle-resolved image from the detected radiation from each of the multiple illuminations.

12. The computer program product according to claim 10, wherein the illumination profile for a first illumination of the multiple illuminations comprises a linear polarization in a first direction without linear polarization in a second direction different than the first polarization and a second illumination of the multiple illuminations comprises a linear polarization in the second direction without linear polarization in the first direction.

13. A metrology apparatus comprising:
a radiation source configured and arranged to project an illumination beam of radiation onto a metrology target on a substrate;
a detector, configured and arranged to detect radiation reflected from the metrology target on the substrate; and
a controller, configured and arranged to controllably vary an illumination profile of the illumination beam for each of multiple illuminations of the same metrology target.

14. The metrology apparatus according to claim 13, wherein:
the radiation source comprises:
a pair of sources, one of the pair of sources being configured and arranged to produce TE polarized light in the illumination beam of radiation, the other of the pair of sources configured and arranged to produce TM polarized light in the illumination beam of radiation, and
an optical element configured and arranged to controllably vary, under control of the controller, an amount and/or location of TE and/or TM polarization in the multiple illuminations using the illumination beam.

15. The metrology apparatus according to claim 13, wherein the controller is configured to create an angle-resolved image using the detected radiation captured from each of the multiple illuminations.

16. The metrology apparatus according to claim 13, wherein the illumination profile for a first illumination of the multiple illuminations comprises a linear polarization in a first direction without linear polarization in a second direction different than the first polarization and a second illumination of the multiple illuminations comprises a linear polarization in the second direction without linear polarization in the first direction.

17. The metrology apparatus according to claim 13, wherein a switching time between two different illumination profiles is essentially the same as or less than a measurement time for an illumination of the metrology target.

18. The metrology apparatus according to claim 13, further comprising an addressable device comprising a plurality of addressable elements configured to, under control of the controller, produce different illumination profiles.

19. The metrology apparatus according to claim 13, wherein the multiple illuminations comprise a plurality of polarization states and the controller is configured to cause performance of a plurality of measurements using the plurality of polarization states and combine the measurements to obtain a combined measurement having characteristics related to a superposition of the plurality of polarization states.

20. The metrology apparatus according to claim 13, wherein the multiple illuminations comprise a plurality of polarization states and further comprising an addressable array of polarizing elements to filter the radiation to polarize selected portions of the radiation at a pupil plane of the metrology apparatus.

* * * * *